US011221902B2

(12) United States Patent
Gurumurthi et al.

(10) Patent No.: US 11,221,902 B2
(45) Date of Patent: Jan. 11, 2022

(54) ERROR HANDLING FOR RESILIENT SOFTWARE

(71) Applicant: ADVANCED MICRO DEVICES, INC., Santa Clara, CA (US)

(72) Inventors: Sudhanva Gurumurthi, Austin, TX (US); Vilas Sridharan, Boxborough, MA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 14 days.

(21) Appl. No.: 16/715,302

(22) Filed: Dec. 16, 2019

(65) Prior Publication Data

US 2021/0182139 A1 Jun. 17, 2021

(51) Int. Cl.
*G06F 11/00* (2006.01)
*G06F 11/07* (2006.01)
*G06F 11/10* (2006.01)
*G06F 9/455* (2018.01)
*G06F 11/30* (2006.01)

(52) U.S. Cl.
CPC ...... *G06F 11/0772* (2013.01); *G06F 9/45533* (2013.01); *G06F 11/0787* (2013.01); *G06F 11/1016* (2013.01); *G06F 11/1044* (2013.01); *G06F 11/1068* (2013.01); *G06F 11/3037* (2013.01)

(58) Field of Classification Search
CPC .. G06F 11/1076; G06F 11/10; G06F 11/1004; G06F 11/08; G06F 11/1044; G06F 11/201
See application file for complete search history.

(56) References Cited

U.S. PATENT DOCUMENTS

2013/0311823 A1* 11/2013 Kaplan ............... G06F 11/1662
  714/15
2015/0268874 A1* 9/2015 Bollandoor ........... G06F 3/0632
  711/103
2018/0358110 A1* 12/2018 Buyuktosunoglu ...... G06N 3/08

OTHER PUBLICATIONS

Sridharan et al., *Eliminating microarchitectural dependency from Architectural Vulnerability*, 2009 IEEE 15th International Symposium on High Performance Computer Architecture, vol. 1, Conference Paper, DOI: 10.1109/HPCA.2009.4798243, Feb. 2009, 12 pages.
Fang et al., *ePVF: An Enhanced Program Vulnerability Factor Methodology for Cross-layer Resilience Analysis*, <https://webcache.googleusercontent.com/search?q=cache:awxfXEKF-AIJ:https://www.cs.virginia.edu/~gurumurthi/papers/dsn16.pdf+&cd=2&hl=en&ct=clnk&gl=us&client=firefox-b-1-d>, IEEE/IFIP International Conference on Dependable Systems and Networks (DSN), dated 2016, 12 pages.
De Kruijf et al., *Relax: an architectural framework for software recovery of hardware faults*, <http://webcache.googleusercontent.com/search?q=cache:dBkARtssi_wJ:research.cs.wisc.edu/vertical/papers/2010/isca10-relax.pdf+&cd=1&hl=en&ct=clnk&gl=us&client=firefox-b-1-d>, Appears in the 37th International Symposium on Computer Architecture (ISCA '10), Jun. 19-23, 2010, 12 pages.

\* cited by examiner

*Primary Examiner* — Charles Ehne

(57) ABSTRACT

Error handling for resilient software includes: receiving data indicating a region of resilient memory; detecting an error associated with a region of memory; and preventing raising an exception for the error in response to the region of memory falling within the region of resilient memory by preventing the region of memory as being identified as including the error.

20 Claims, 5 Drawing Sheets

ERROR HANDLING FOR RESILIENT SOFTWARE

BACKGROUND

Errors in memory cause exceptions to be raised by the operating system. Certain applications and computations are inherently resilient to such errors.

DETAILED DESCRIPTION

Figure 1:
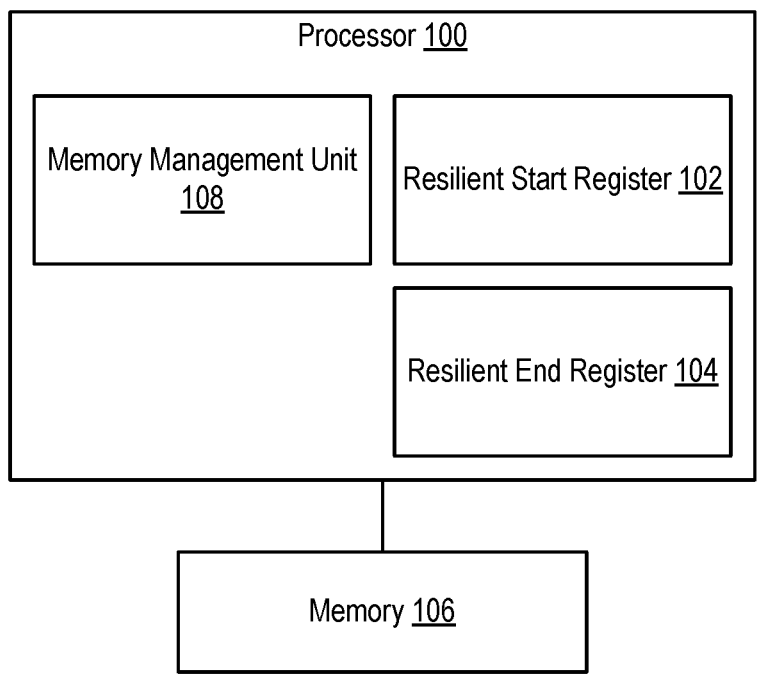
FIG. 1 is a block diagram of an example processor for error handling for resilient software according to some embodiments.

In some embodiments, a method of error handling for resilient software includes receiving data indicating a region of resilient memory; detecting an error associated with a region of memory; and preventing raising an exception for the error in response to the region of memory falling within the region of resilient memory by preventing the region of memory as being identified as including the error.

In some embodiments, the method includes storing an indication of the region of resilient memory in a plurality of registers; and determining that the region of memory falls within the region of resilient memory based on the plurality of registers. In some embodiments, the plurality of registers include a first thread-specific register defining a beginning of the region of resilient memory and a second thread-specific register defining an end of the region of resilient memory. In some embodiments, the first thread-specific register and second thread-specific register are included in a plurality of pairs of thread-specific registers each defining a corresponding region of resilient memory. In some embodiments, determining that the region of memory falls within the region of resilient memory includes: translating a virtual address range of the region of resilient memory stored in the plurality of registers to a physical address range; and determining that the region of memory falls within the physical address range. In some embodiments, preventing raising an exception includes refraining from flagging a region of memory associated with the error as storing data associated with the error. In some embodiments, the method further includes: detecting another error associated with another region of memory; determining that the other region of memory falls outside the region of resilient memory; and allow an exception associated with the other region of memory. In some embodiments, the memory includes Error Correction Code (ECC) memory, and detecting the error associated with the region of memory includes receiving an indication of the region of memory from the Error Correction Code memory. In some embodiments, preventing raising an exception includes suppressing a signal to a hypervisor. In some embodiments, preventing raising an exception includes ignoring a signal indicating the error by a hypervisor.

In some embodiments, an apparatus for error handling for resilient software performs steps including receiving data indicating a region of resilient memory; detecting an error associated with a region of memory; and preventing raising an exception for the error in response to the region of memory falling within the region of resilient memory by preventing the region of memory as being identified as including the error.

In some embodiments, the steps include storing an indication of the region of resilient memory in a plurality of registers; and determining that the region of memory falls within the region of resilient memory based on the plurality of registers. In some embodiments, the plurality of registers include a first thread-specific register defining a beginning of the region of resilient memory and a second thread-specific register defining an end of the region of resilient memory. In some embodiments, the first thread-specific register and second thread-specific register are included in a plurality of pairs of thread-specific registers each defining a corresponding region of resilient memory. In some embodiments, determining that the region of memory falls within the region of resilient memory includes: translating a virtual address range of the region of resilient memory stored in the plurality of registers to a physical address range; and determining that the region of memory falls within the physical address range. In some embodiments, preventing raising an exception includes refraining from flagging a region of memory associated with the error as storing data associated with the error. In some embodiments, the steps further include: detecting another error associated with another region of memory; determining that the other region of memory falls outside the region of resilient memory; and allow an exception associated with the other region of memory. In some embodiments, the memory includes Error Correction Code (ECC) memory, and detecting the error associated with the region of memory includes receiving an indication of the region of memory from the Error Correction Code memory. In some embodiments, preventing raising an exception includes suppressing a signal to a hypervisor. In some embodiments, preventing raising an exception includes ignoring a signal indicating the error by a hypervisor.

FIG. 1 is a block diagram of a non-limiting example processor 100 according to some embodiments. The example processor 100 can be implemented in a variety of computing devices, including mobile devices, personal computers, peripheral hardware components, gaming devices, set-top boxes, and the like. The processor 100 includes a resilient start register 102 and resilient end register 104. The resilient start register 102 stores a start address (e.g., a virtual memory address) of an area of memory 106 used for resilient software or computations. Software or computations are considered resilient when they may maintain an adequate level of service or performance when a portion of used memory 106 is corrupted or subject to an error (e.g., a bit flip). For example, software with internal measures for accounting for these errors are considered resilient, and the areas of memory 106 used by such software is considered resilient memory 106. The resilient end register 104 stores an end address (e.g., a virtual memory address) of the resilient region of memory 106.

The memory 106 includes main memory such as Random Access Memory (RAM). For example, the memory includes Error Correction Code memory 106 including internal components to detect data corruption. The memory 106 detects an error associated with a region of memory 106. Regions of memory 106 that are subject to error include blocks of memory, pages of memory, bytes of memory, or other subdivisions of memory. For example, the memory 106 detects a bit flip or other corruption based on a parity bit or error correction code for the region of memory 106. In existing solutions, unless the error is corrected, the memory 106 marks the region of memory as "poisoned" using a flag or other identifier. When the poisoned region of memory 106 is accessed by software or computation (e.g., when the address of the poisoned region is added to a load-store queue, etc.), an exception is raised (e.g., a Machine Check Exception) and handled by the operating system. This results in significant overhead. Where the software that accessed the poisoned region is resilient to the error, the exception need not have been raised and the resulting computational overhead would be unnecessary.

Instead, the processor 100 receives an indication of a region of resilient memory 106. Regions of resilient memory 106 are identified by any approach to one skilled in the art, and outside the scope of this disclosure. For example, an analysis tool analyzes software to identify particular regions of resilient memory 106. The start address of the region of resilient memory 106 is stored in the resilient start register 102 and the end of the region of resilient memory 106 is stored in the resilient end register 104. In some embodiments, the resilient start register 102 and resilient end register 104 are thread-specific registers. Thus, the values in the resilient start register 102 and resilient end register 104 are stored and/or loaded when context switching between threads.

The processor 100 then detects an error associated with a region of memory 106. For example, the processor 100 receives a signal from the memory 106 in response to the memory 106 detecting the error (e.g., using error codes or other functionality of the memory 106). The processor 100 then determines whether the region of memory 106 associated with the error falls within the region of resilient memory 106 defined by the resilient start register 102 and resilient end register 104. Where the resilient start register 102 and resilient end register 104 define the region of resilient memory 106 using virtual memory addresses, the processor translates a virtual address range of the region of resilient memory 106 stored in the resilient start register 102 and resilient end register 104 to a physical address range of resilient memory 106 (e.g., using a memory management unit 108). The processor 100 then determines whether the physical address of the region of memory 106 associated with the error falls within the physical address range of resilient memory 106.

Where the region of memory 106 associated with the error falls outside the region of resilient memory 106 defined by the resilient start register 102 and resilient end register 104, an exception associated with the region of memory 106 is allowed. In other words, the processor 100 takes no action in preventing the memory 106 from flagging the region associated with the error as poisoned, thus allowing an exception to be raised for handling by the operating system when data stored in the flagged region is ingested, accessed and/or processed.

Where the region of memory 106 associated with the error falls within the region of resilient memory 106 defined by the resilient start register 102 and resilient end register 104, the processor 100 prevents raising an exception for the error. For example, in an embodiment, the processor 100 sends a signal to the memory 106 to prevent flagging the region of memory 106 associated with the error as poisoned, or sends a signal to the memory 106 to unflag the region of memory 106 associated with the error as poisoned. Thus, when the region of memory 106 associated with the error is ultimately ingested or accessed, no exception is raised despite the error still being present.

Although the preceding discussion describes the processor 100 as having a single resilient start register 102 and resilient end register 104, in an alternative embodiment the processor 100 includes a plurality of pairs of resilient start registers 102 and resilient end registers 104 each capable of storing memory addresses defining corresponding regions of resilient memory 106. Thus, when an error associated with a region of memory 106 is detected, the region of memory 106 associated with the error is compared with each region of resilient memory 106 to determine if the region of memory falls within a region of resilient memory 106.

In an alternative embodiment, instead of the processor 100 detecting the error associated with the region of memory 106 and preventing raising an exception for the error, an operating system detects the error in the form of an indication to raise an exception for the error. The operating system then determines whether the region of memory 106 associated with the error falls within the region of resilient memory 106 using the resilient start register 102 and resilient end register 104 and/or a page table. Where the operating system determines that the region of memory 106 falls within the region of resilient memory 106, the operating system then refrains from raising the exception and/or refrains from executing any exception handlers associated with the exception. In an alternative embodiment, where the operating system is executed in a virtual machine, the operating system refrains from forwarding the exception to a hypervisor. In a further alternative embodiment, a hypervisor receives a raised exception and determines whether a region of memory associated with the error is included in a region of resilient memory. Where the hypervisor determines that the region of memory 106 falls within the region of resilient memory 106, the hypervisor refrains from executing any exception handlers associated with the exception (e.g., the hypervisor ignores the error).

Figure 2:
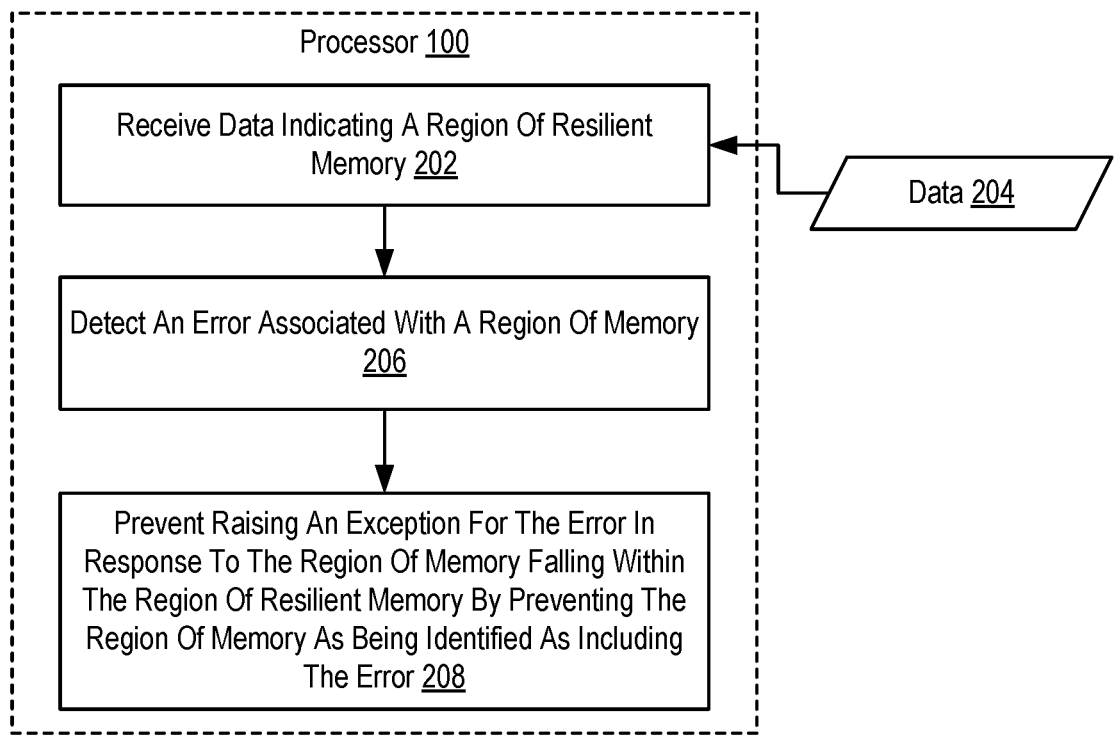
FIG. 2 is a flowchart of an example method for error handling for resilient software according to some embodiments.

For further explanation, FIG. 2 sets forth a flow chart illustrating an exemplary method for error handling for resilient software according to embodiments of the present disclosure that includes receiving 202 (e.g., by a processor 100) data 204 indicating a region of resilient memory 106. Regions of resilient memory 106 are identified by any approach to one skilled in the art. The identified region of resilient memory 106 is then indicated to the processor 100. For example, an analysis tool analyzes software to identify particular regions of resilient memory 106. In an embodiment, the region of resilient memory 106 is identified in the data 204 as a start address and an end address. The received start address and end address are then stored in respective registers (e.g., a resilient start register 102 and a resilient end register 104).

The method of FIG. 2 also includes detecting 202 an error associated with a region of memory 106. For example, the memory 106 identifies a region of memory 106 subject to an error (e.g., a bit flip or other corruption) using error correcting codes or another approach. The memory 106 then signals the processor 100 by identifying the region of memory 106. The region of memory 106 is identified as a block of memory 106, or other subdivision or unit of memory 106.

The method of FIG. 2 also includes preventing 208 raising an exception for the error in response to the region of memory 106 (e.g., the region of memory 106 associated with the error) falling within the region of resilient memory 106 by preventing the region of memory 106 from being identified as including the error. For example, the processor 100 determines that the region of memory 106 falls within the region of resilient memory 106 by determining if the region of memory 106 falls within a range of memory bound by a start address stored in a first register (e.g., a resilient start register 102) and an end address stored in a second register (e.g., a resilient end register 104). Preventing 208 raising an exception for the error includes signaling or indicating to the memory 106 to refrain from flagging the region of memory 106 as "poisoned," or to reverse a flag indicating the region of memory 106 as "poisoned." Thus, no exception is raised when the region of memory 106 is accessed by resilient software despite the error still being present.

Figure 3:
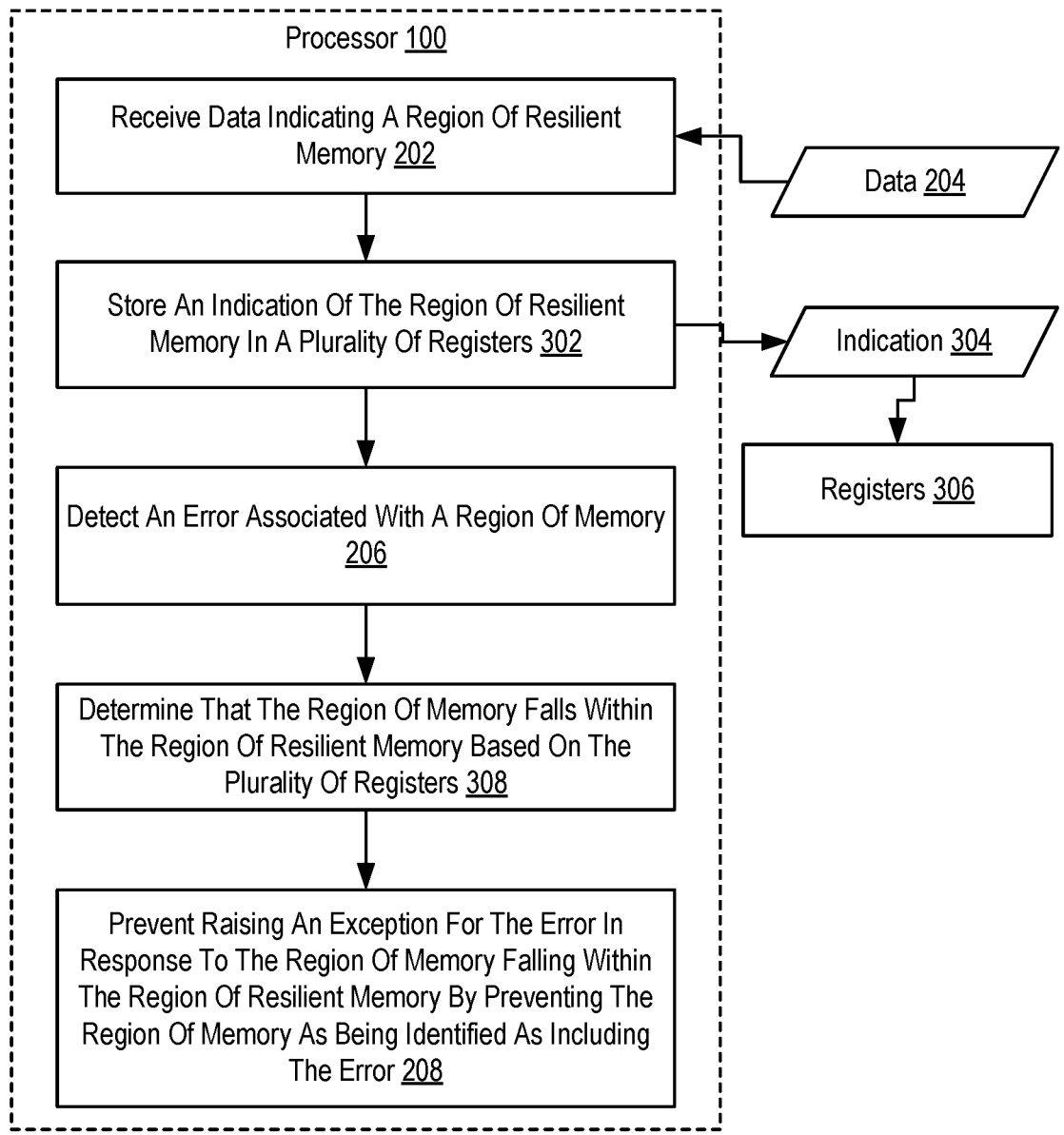
FIG. 3 is a flowchart of an example method for error handling for resilient software according to some embodiments.

For further explanation, FIG. 3 sets forth a flow chart illustrating an exemplary method for error handling for resilient software according to embodiments of the present disclosure that includes receiving 202 (e.g., by a processor 100) data 204 indicating a region of resilient memory 106; detecting 206 an error associated with a region of memory 106 and preventing 208 raising an exception for the error in response to the region of memory 106 falling within the region of resilient memory 106 by preventing the region of memory as being identified as including the error.

The method of FIG. 3 differs from FIG. 2 in that the method of FIG. 3 also includes storing 302 an indication 304 of the region of resilient memory 106 in a plurality of registers 306. For example, a start address for the region of resilient memory 106 is stored in a resilient start register 102 and an end address for the region of resilient memory 106 is stored in a resilient end register 104. In an embodiment, the resilient start register 102 and resilient end register 104 are included in a plurality of pairs of resilient start registers 102 and resilient end registers 104 with each pair capable of identifying a corresponding region of resilient memory 106. In an embodiment, the resilient start register 102 and resilient end register 104 are thread-specific registers 306 stored and/or loaded during a context switch between threads. In an embodiment, the start address and end address are stored as virtual addresses.

The method of FIG. 3 further differs from FIG. 2 in that the method of FIG. 3 also includes determining 308 that the region of memory falls 106 within the region of resilient memory 106 based on the plurality of registers 306. For example, determining 308 that the region of memory falls 106 within the region of resilient memory 106 based on the plurality of registers 306 includes determining that the address of the region of memory 106 (e.g., associated with the error) is greater than or equal to a start address for the region of resilient memory 106 stored in a first register 306 (e.g., a resilient start register 102) and less than or equal to an end address for the region of resilient memory 106 stored in a second register 306 (e.g., a resilient end register 104).

Figure 4:
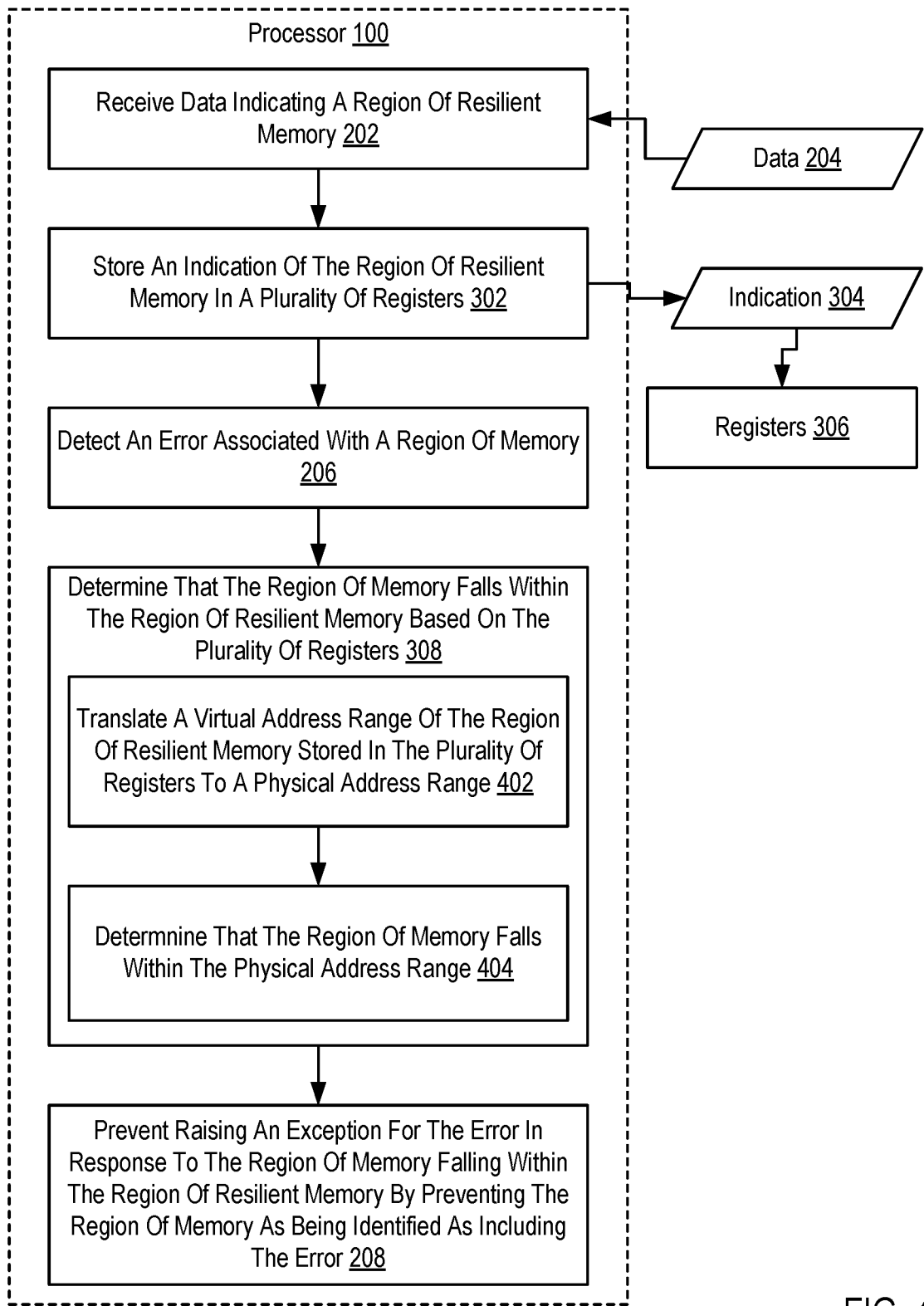
FIG. 4 is a flowchart of an example method for error handling for resilient software according to some embodiments.

For further explanation, FIG. 4 sets forth a flow chart illustrating an exemplary method for error handling for resilient software according to embodiments of the present disclosure that includes receiving 202 (e.g., by a processor 100) data 204 indicating a region of resilient memory 106; storing 302 an indication 304 of the region of resilient memory 106 in a plurality of registers 306; detecting 206 an error associated with a region of memory 106; determining 308 that the region of memory falls 106 within the region of resilient memory 106 based on the plurality of registers 306; and preventing 208 raising an exception for the error in response to the region of memory 106 falling within the region of resilient memory 106 by preventing the region of memory as being identified as including the error.

The method of FIG. 4 differs from FIG. 3 in that determining 308 that the region of memory falls 106 within the region of resilient memory 106 based on the plurality of registers 306 includes translating 402 a virtual address range of the region of resilient memory stored in the plurality of registers 306 to a physical address range. For example, a memory management unit 108 translates a virtual start address stored in a first register 306 (e.g., a resilient start register 102) and a virtual end address stored in a second register 306 (e.g., a resilient end register 104) to a respective physical start address and physical end address. As another example, a page table is queried to translate a virtual start address stored in a first register 306 (e.g., a resilient start register 102) and a virtual end address stored in a second register 306 (e.g., a resilient end register 104) to a respective physical start address and physical end address. Thus, the physical address range of the region of resilient memory 106 is bound by the physical start address and physical end address.

The method of FIG. 4 differs from FIG. 3 in that determining 308 that the region of memory falls 106 within the region of resilient memory 106 based on the plurality of registers 306 includes determining 404 that the region of memory 106 (e.g., the region of memory 106 associated with the error) falls within the physical address range. As the region of memory 106 associated with the error is identified by a physical address, the physical address of the region of memory 106 is then compared with physical addresses defining the region of resilient memory 106.

Figure 5:
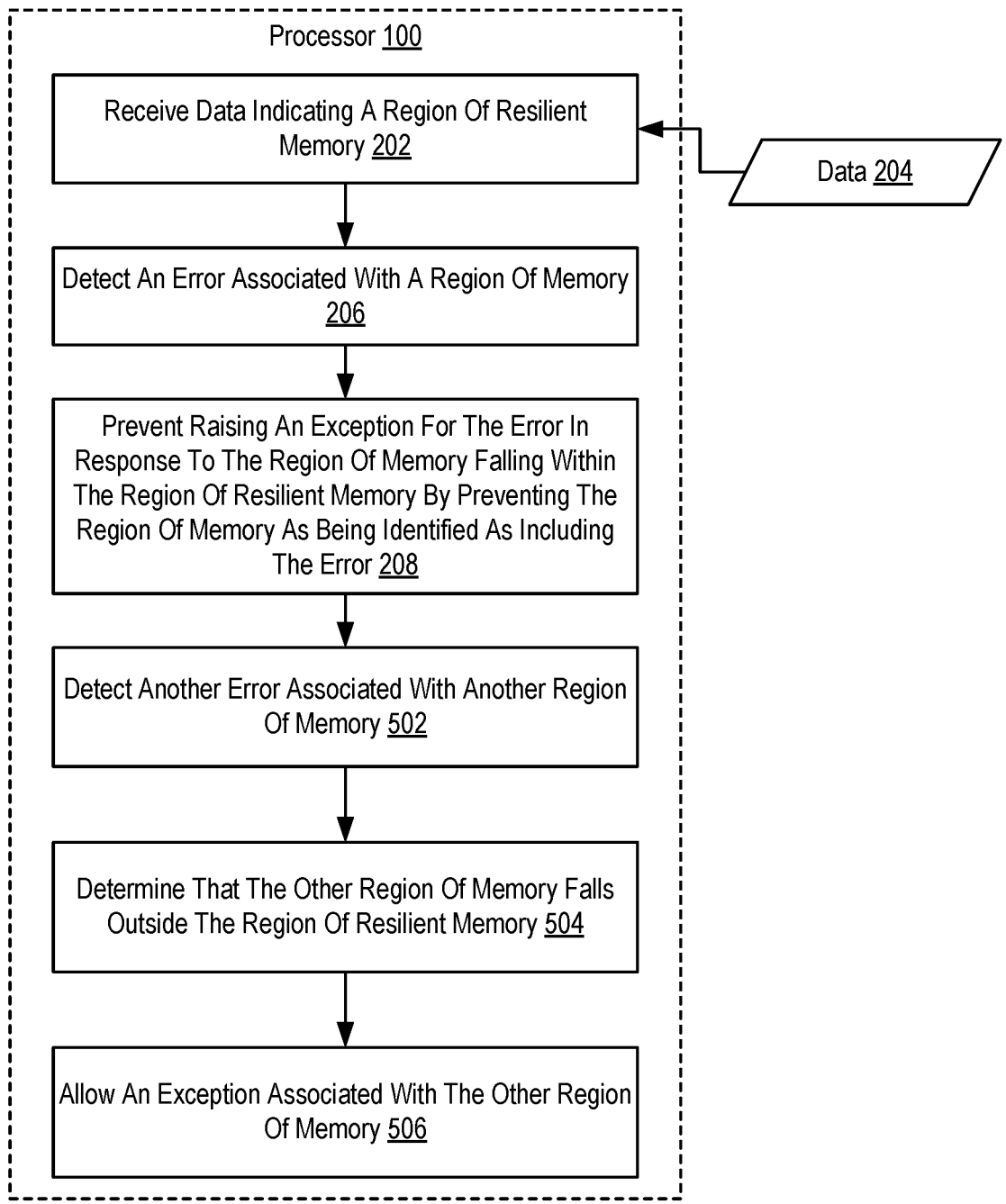
FIG. 5 is a flowchart of an example method for error handling for resilient software according to some embodiments.

For further explanation, FIG. 5 sets forth a flow chart illustrating an exemplary method for error handling for resilient software according to embodiments of the present disclosure that includes receiving 202 (e.g., by a processor 100) data 204 indicating a region of resilient memory 106; detecting 206 an error associated with a region of memory 106 and preventing 208 raising an exception for the error in response to the region of memory 106 falling within the region of resilient memory 106 by preventing the region of memory as being identified as including the error.

The method of FIG. 5 differs from FIG. 2 in that the method of FIG. 5 also includes detecting 502 another error associated with another region of memory 106. For example, the memory 106 sends another signal or indication of another region of memory 106 identified as including the other error. The method of FIG. 5 also includes determining 504 that the other region of memory 106 falls outside the region of resilient memory 106 (e.g., as indicated in data 204 and indicated in a resilient start register 102 and resilient end register 104).

The method of FIG. 5 also includes allowing 506 an exception association with the other region of memory 106. For example, the processor 100 signals the memory 106 to flag or otherwise identify the other region of memory 106 as "poisoned" (e.g., including the other error). As another example, the processor 100 refrains from signaling the memory 106, thereby allowing the memory 106 flag the other region of memory 106. Thus, when the other region of memory 106 is consumed or accessed, an exception is raised.

In view of the explanations set forth above, readers will recognize that the benefits of error handling for resilient software according to embodiments of the present disclosure include:

Improved performance of a computing system by preventing exceptions from being raised when errors occur in resilient error of memory, preventing the overhead involved in exception handling.

Improved performance of a computing system by identifying regions of resilient memory using hardware-based solutions, reducing overhead compared to software-based solutions.

Exemplary embodiments of the present disclosure are described largely in the context of a fully functional computer system for error handling for resilient software. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of error handling for resilient software, the method comprising:
   receiving data indicating a region of resilient memory;
   detecting an error associated with a region of memory that falls within the region of resilient memory; and
   preventing, without correcting the error, an exception for the error from being raised by preventing the region of memory as being identified as including the error.

2. The method of claim 1, further comprising:
   storing an indication of the region of resilient memory in a plurality of registers; and
   determining that the region of memory falls within the region of resilient memory based on the plurality of registers.

3. The method of claim 2, wherein the plurality of registers comprise a first thread-specific register defining a beginning of the region of resilient memory and a second thread-specific register defining an end of the region of resilient memory.

4. The method of claim 3, wherein the first thread-specific register and second thread-specific register are included in a plurality of pairs of thread-specific registers each defining a corresponding region of resilient memory.

5. The method of claim 2, wherein determining that the region of memory falls within the region of resilient memory comprises:
   translating a virtual address range of the region of resilient memory stored in the plurality of registers to a physical address range; and
   determining that the region of memory falls within the physical address range.

6. The method of claim 1, wherein preventing raising an exception comprises refraining from flagging a region of memory associated with the error as storing data associated with the error.

7. The method of claim 1, further comprising:
   detecting another error associated with another region of memory;
   determining that the other region of memory falls outside the region of resilient memory; and
   allowing an exception associated with the other region of memory.

8. The method of claim 1, wherein the memory comprises Error Correction Code (ECC) memory, and wherein detecting the error associated with the region of memory comprises receiving an indication of the region of memory from the Error Correction Code memory.

9. The method of claim 1, wherein preventing raising an exception comprises suppressing a signal to a hypervisor.

10. The method of claim 1, wherein preventing raising an exception comprises ignoring a signal indicating the error by a hypervisor.

11. An apparatus for error handling for resilient software, the apparatus configured to:
    receive data indicating a region of resilient memory;
    detect an error associated with a region of memory that falls within the region of resilient memory; and
    preventing, without correcting the error, an exception for the error from being raised by preventing the region of memory as being identified as including the error.

12. The apparatus of claim 11, further configured to:
    storing an indication of the region of resilient memory in a plurality of registers; and
    determining that the region of memory falls within the region of resilient memory based on the plurality of registers.

13. The apparatus of claim 12, wherein the plurality of registers comprise a first thread-specific register defining a beginning of the region of resilient memory and a second thread-specific register defining an end of the region of resilient memory.

14. The apparatus of claim 13, wherein the first thread-specific register and second thread-specific register are included in a plurality of pairs of thread-specific registers each defining a corresponding region of resilient memory.

15. The apparatus of claim 12, wherein determining that the region of memory falls within the region of resilient memory comprises:
    translating a virtual address range of the region of resilient memory stored in the plurality of registers to a physical address range; and
    determining that the region of memory falls within the physical address range.

16. The apparatus of claim 11, wherein preventing raising an exception comprises refraining from flagging a region of memory associated with the error as storing data associated with the error.

17. The apparatus of claim 11, further configured to:
    detecting another error associated with another region of memory;
    determining that the other region of memory falls outside the region of resilient memory; and
    allowing an exception associated with the other region of memory.

18. The apparatus of claim 11, wherein the memory comprises Error Correction Code (ECC) memory, and wherein detecting the error associated with the region of memory comprises receiving an indication of the region of memory from the Error Correction Code memory.

19. The apparatus of claim 11, wherein preventing raising an exception comprises suppressing a signal to a hypervisor.

20. The apparatus of claim 11, wherein preventing raising an exception comprises ignoring a signal indicating the error by a hypervisor.

\* \* \* \* \*